(12) United States Patent
Tang et al.

(10) Patent No.: US 11,274,971 B2
(45) Date of Patent: Mar. 15, 2022

(54) TEMPERATURE SENSOR

(71) Applicant: Semitronix Corporation, Hangzhou (CN)

(72) Inventors: Zhong Tang, Hangzhou (CN); Zheng Shi, Hangzhou (CN); Weiwei Pan, Hangzhou (CN); Zhenyan Huang, Hangzhou (CN)

(73) Assignee: Semitronix Corporation, Hangzhou (CN)

( * ) Notice: Subject to any disclaimer, the term of this patent is extended or adjusted under 35 U.S.C. 154(b) by 195 days.

(21) Appl. No.: 16/726,917

(22) Filed: Dec. 25, 2019

(65) Prior Publication Data

US 2020/0209070 A1 Jul. 2, 2020

(30) Foreign Application Priority Data

Dec. 26, 2018 (CN) .......................... 201811601285.9

(51) Int. Cl.
| | |
|---|---|
| *G01K 7/01* | (2006.01) |
| *G01K 15/00* | (2006.01) |
| *H03K 19/20* | (2006.01) |
| *H03K 19/08* | (2006.01) |
| *H03K 19/173* | (2006.01) |

(52) U.S. Cl.
CPC ............. *G01K 7/01* (2013.01); *G01K 15/005* (2013.01); *H03K 19/08* (2013.01); *H03K 19/173* (2013.01); *H03K 19/20* (2013.01)

(58) Field of Classification Search
None
See application file for complete search history.

(56) References Cited

U.S. PATENT DOCUMENTS

2017/0187358 A1* 6/2017 Takeuchi ............. H03K 3/0315

\* cited by examiner

*Primary Examiner* — Jany Richardson
(74) *Attorney, Agent, or Firm* — Syncoda LLC; Feng Ma

(57) ABSTRACT

A temperature sensor includes a NAND gate and a plurality of delay units. The NAND gate includes a first and a second input terminals, and an output terminal. The first input terminal is configured to receive an external starting control signal. The plurality of delay units are connected in series. An input end of the first delay unit is connected to the output terminal of the NAND gate. An output end of the last delay unit is connected to the second input terminal of the NAND gate, thereby forming a ring oscillator structure. The temperature sensor can realize conversion of temperature-leakage-frequency based on the ring oscillator structure in a temperature range of −40~125° C., thereby simplifying design complexity and achieves high accuracy.

19 Claims, 8 Drawing Sheets

TEMPERATURE SENSOR

CROSS-REFERENCE TO RELATED APPLICATION

The present application claims priority to Chinese Patent Application No. CN 201811601285.9 filed on Dec. 26, 2018, the disclosure of which is hereby incorporated by reference in its entirety.

BACKGROUND

With the continuously shrinking of CMOS process nodes, the chip's functions are more and more complex and its integration degree is higher and higher, which lead to chip heating problem becomes more and more serious. Therefore, in advanced technologies, the on-chip heat management can be important in designing SoC, processor and DRAM. In the application of on-chip heat management, multiple locations around complex digital modules need to be measured frequently, therefore the temperature sensor should be with the characteristics of small area, strong anti-interference ability and low cost.

SUMMARY

The inventors of the present disclosure have recognized that, although existing different types of temperature sensors have different advantages, they may not be able to meet the current requirements of on-chip heat management completely.

Various embodiments of the present disclosure provide a temperature sensor, which can work normally under digital power supply and solve the problem of voltage sensitivity.

A temperature sensor according to some embodiments of the present disclosure can include a NAND gate and K delay units, where K is an even number greater than 0. The NAND gate comprises two input terminals and an output terminal, one input terminal inputs starting control signal. K delay units are connected in series, the input end of the first delay unit is connected to the output terminal of the NAND gate, and the output end of the last delay unit is connected to another input terminal of the NAND gate. It can be seen that the temperature sensor circuit is a type of ring oscillator structure.

Each delay unit includes n stage inverters in series (n is an odd number greater than 1), and each stage inverter is connected with a PMOS and a NMOS to control the inverter in on-state or off-state.

There can be an exponential relationship between leakage current ($I_{off}$) of MOS transistor and temperature (T):

$$I_{off} \approx \alpha_1 \cdot e^{(\frac{\alpha_2}{T})},$$

wherein $\alpha_1$ and $\alpha_2$ are constants for a particular chip; in ring oscillator, the relationship between leakage current and output frequency also is exponential, the leakage current of MOS transistor is exponential relationship to temperature; it can deduce that the output frequency is exponential relationship to temperature, therefore, the temperature can be obtained by the output frequency of the ring oscillator. Therefore, the temperature variation can be monitored by the temperature sensor with digital output.

In the temperature sensor according to some embodiments of the present disclosure, the more inverters the higher the accuracy of temperature measurement, and the measurement time will also be increased accordingly. Therefore, the number of inverters in the temperature sensor can be configured flexibility according to the requirements in the specific scenarios.

In some embodiments, the connection of n stage inverters in each delay unit as follows: The output end of the former stage inverter is connected with the input end of the latter stage inverter; define the PMOS transistor and NMOS transistor connected with the i-th stage inverter as $M_{Pi}$, and $M_{Ni}$ respectively, the source end of $M_{Ni}$ is connected to GND, the drain end of $M_{Ni}$ is connected to the i-th stage inverter, the gate electrode of $M_{Ni}$ is connected to the signal line $V_{Ni}$, the drain end of $M_{Pi}$ is connected to the i-th stage inverter, the source end of $M_{Pi}$ is connected to power supply (higher potential), the gate electrode of $M_{Pi}$ is connected to the signal line $V_{Pi}$, the substrate end of $M_{Pi}$ is connected to the signal line $V_{PB}$, i is an integer and i∈[1, n].

In some embodiments, each delay unit of the temperature sensor can have the same number of inverters.

In some embodiments, the gate electrodes of the same stage NMOS transistors in all delay units are connected to one signal line; and the gate electrodes of the same stage PMOS transistors in all delay units are connected to one signal line. That is, $V_{Ni}$ with the same value of i in all delay units are connected to a same signal line, and $V_{Pi}$ with the same value of i in all delay units are connected to a same signal line.

Various embodiments of the present disclosure also provide a method of temperature measurement with the temperature sensor according to some embodiments of the present disclosure. The method includes that the output frequency of the temperature sensor in P-mode or N-mode is measured to obtain the temperature value. The P-mode refers to: for the temperature sensor, the NMOS transistors in each delay unit are in on-state, one of the PMOS transistors in each delay unit is in off-state, and the other PMOS transistors in each delay unit are in on-state; therefore, the off-state PMOS transistors work in the state of leakage. The N-mode refers to: for the temperature sensor, the PMOS transistors in each delay unit are in on-state, and one of the NMOS transistors in each delay unit is in off-state, the other NMOS transistors in each delay unit are in on-state; therefore, the off-state NMOS transistors work in the state of leakage.

Take the P-mode as the example, the principle of temperature measurement as follows: According to the requirements of measurement, in each delay unit of the temperature sensor, all the NMOS transistors are controlled in on-state, one of the PMOS transistors is controlled in off-state, the other PMOS transistors are controlled in on-state; therefore all the inverters in each delay unit work normally except the inverter which connected to the off-state PMOS transistor. The normal working inverter is equivalent in function to an ordinary buffer, the inverter connected to the off-state PMOS transistor works in the state of leakage. A jump from high level to low level is applied at the input end of the delay unit, a low level is outputted by the inverter connected to the off-state PMOS transistor, the outputted low level is gradually charged until it reaches the threshold voltage of the next stage inverter, the next stage inverter works and reverses its input. If the inverter(s) after the next stage are work normally, the inverter(s) continue to work according the function of inverter.

It can be seen that, in a delay unit, the i-th stage inverter that works in the state of leakage determines the delay of the delay unit for the most part; therefore, in the ring oscillator structure comprised with the delay units, the output frequency is also determined by the i-th stage inverter that works in the state of leakage. Because of the strong correlation between leakage and temperature, the output frequency is also strongly correlated with temperature due to the strong correlation between leakage current of MOS transistor and output frequency of the ring oscillator. Therefore, the output frequency of the ring oscillator structure can be used to detects temperature changes.

The principles of temperature measurement through the N-mode of the temperature sensor is similar to that through the P-mode, and therefore are not repeated herein.

In some embodiments, inverters of all the delay units functioning in leakage states are at the same stage, i.e., having the same i value in each delay unit.

In some embodiments, the method for temperature measurement in P-mode can include the following steps:

P1) for each delay unit of the temperature sensor, control all the NMOS transistors in on-state, one of the PMOS transistors $M_{Pi}$ in off-state, and the other PMOS transistors in on-state, then measure the temperature value $T_{Pi}$ through the temperature sensor;

P2) repeat the step P1) with traversing the value of variable i, and the corresponding temperature value $T_{Pi}$ can be obtained respectively, i is an integer and $i \in [1, n]$;

P3) take the average value of the temperature value $T_{Pi}$ as the final value of temperature.

The method of temperature measurement in the P-mode of the temperature sensor is used to obtain temperature accurately, several temperature values are measured by traversing the PMOS transistors in leakage state respectively, and the average value of the several temperature values as the final value of temperature to offset the process deviation of single PMOS.

In some embodiments, the method for temperature measurement in N-mode can include the following steps:

N1) for each delay unit of the temperature sensor, control all the PMOS transistors in on-state, one of the NMOS transistors $M_{Ni}$ in off-state, and the other NMOS transistors in on-state, then measure the temperature value $T_{Ni}$ through the temperature sensor;

N2) repeat the step N1) with traversing the value of variable i, and the corresponding temperature value $T_{Ni}$ can be obtained respectively, i is an integer and $i \in [1, n]$;

N3) take the average value of the temperature value $T_{Ni}$ as the final value of temperature.

The method of temperature measurement in the N-mode of the temperature sensor can be used to obtain temperature accurately, several temperature values are measured by traversing the NMOS transistors in leakage state respectively, and the average value of the several temperature values as the final value of temperature to offset the process deviation of single NMOS.

Various embodiments of the present disclosure also provide a method of supply voltage measurement with the temperature sensor according to some embodiments of the present disclosure. Control the temperature sensor in voltage-mode, and obtain the supply voltage trough measuring the output frequency of the temperature sensor; the voltage-mode refers to: control all the PMOS transistors and NMOS transistors in each delay unit of the temperature sensor in on-state. In the voltage-mode, for a delay unit, the sensitivity of supply voltage is much greater than that of temperature, the output frequency of the ring oscillator structure has approximate linear relationship with supply voltage, therefore, the voltage-mode of the temperature sensor can be used to measure the value of the supply voltage.

The delay of single delay unit mainly depends on the delay of the inverter which works in the leakage state, the delay of the inverter that functions in the leakage state mainly depends on the leakage and the threshold voltage of the next-stage inverter. With the increase of supply voltage, both of the threshold voltage of the latter stage inverter and the leakage increase correspondingly, which can reduce the sensitivity between output frequency and supply voltage. To further reduce the influence to the output frequency because of voltage fluctuation, the supply voltage can be measured in voltage-mode of the temperature sensor, then the supply voltage can be used for calibration of temperature measurement.

Various embodiments of the present disclosure also provide a method of temperature measurement calibration, wherein, in the voltage-mode, measure the output frequency of the temperature senor to obtain the supply voltage, then the supply voltage is used for calibration of temperature measurement in P-mode or N-mode, so as to improve the accuracy of temperature measurement.

Various embodiments of the present disclosure also provide a method of voltage calibration, wherein, the temperature can be obtained in the P-mode and N-mode respectively, and the temperature value in P-mode and/or N-mode can be used for calibration of voltage measurement in voltage-mode, so as to improve the accuracy of voltage measurement.

Various embodiments of the present disclosure also provide a method for process corner evaluation with the temperature sensor according to some embodiments of the present disclosure, apply a known voltage to the temperature sensor, and control the temperature sensor in the voltage-mode, the process corner can be evaluated through the output distribution of different chips.

Compared with conventional temperature sensors, the temperature sensor according to some embodiments of the present disclosure can have one or more of the following advantages:

(1) the temperature sensor realizes the conversion from temperature to current based on the relationship between leakage current of MOS transistors and temperature, and further realizes the conversion from current to frequency based on the ring oscillator structure, so as to realize digital output of temperature measurement;

(2) the temperature sensor can work normally in the temperature range of −40~125° C. and under digital power supply less than 1V;

(3) the temperature sensor simplifies the design complexity and achieves high accuracy (error less than 2° C.), solves the problem of voltage sensitivity, occupies a small area, and the circuit is reconfigurable according different requirements which can further realize controllable circuit area;

(4) the temperature sensor has according to some embodiments of the present disclosure can have the feature of low power consumption, which can meet the low power consumption requirement of level μW, so that to solve the problem of self-heating and aging;

(5) the temperature sensor can be worked in different patterns by simple digital control, thus to solve the problem of voltage sensitivity, reduces process deviation and voltage influence, improves circuit robustness, temperature measurement accuracy, and design reliability, meanwhile has strong practicability;

(7) the temperature sensor is designed based on standard cell library, including common inverters (INV), a NAND gate, PMOS transistors for power gating (Header) and NMOS transistors for power gating (Footer), so as to migrate and revise in different process conveniently.

It is to be understood that the above general descriptions and detailed descriptions below are only exemplary and explanatory and not intended to limit the present disclosure.

DETAILED DESCRIPTION

Figure 1:
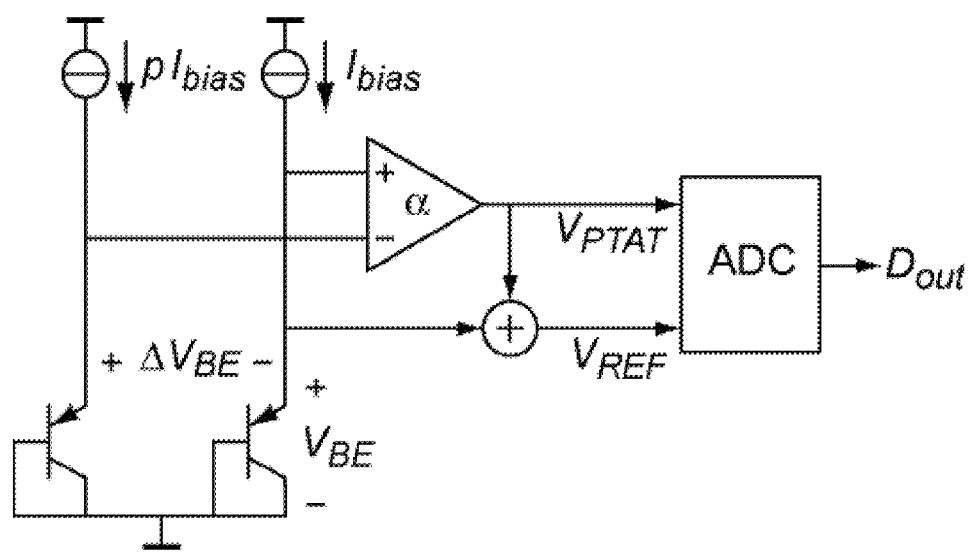
FIG. 1 illustrates a schematic diagram of a temperature sensor based on parasitic transistors.
Figure 2:
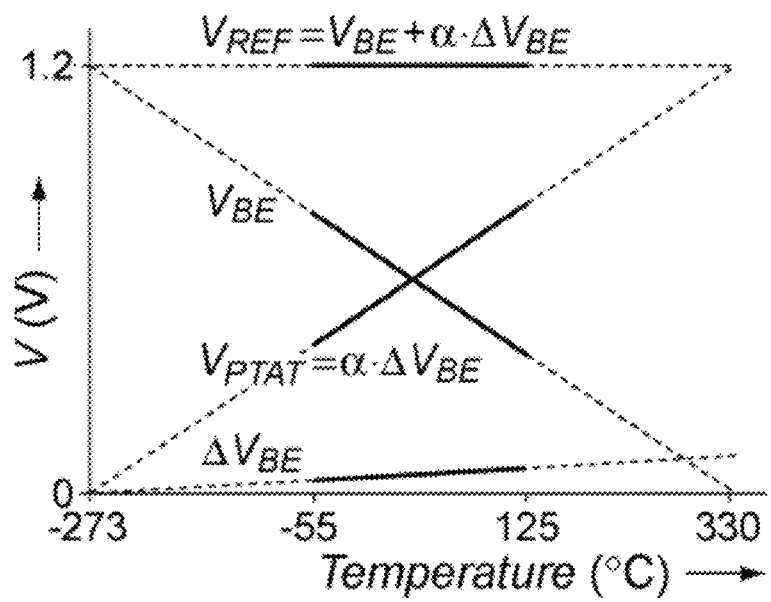
FIG. 2 is a diagram illustrating temperature dependency of key voltages in a sensor.

Most of the traditional CMOS temperature sensors use parasitic triode as temperature-sensitive device, which can achieve high precision and high linearity. As shown in FIG. 1, the emitter reference voltage $V_{BE}$ of BJT (bipolar junction transistor) has negative linear relationship with temperature, the reference voltage difference between two emitters of BJT $\Delta V_{BE}$ has positive linear relationship with temperature. $V_{REF}=V_{BE}+\alpha \times \Delta V_{BE}$, the reference voltage $V_{REF}$ is independent of temperature. Through amplifying the $\Delta V_{BE}$ and D/A conversion, a ratio of $V_{PTAT}$ to $V_{REF}$ is outputted, as shown in FIG. 2, the higher the ratio corresponding to the higher the temperature (PTAT: proportional to absolute temperature). This kind of traditional CMOS temperature sensor usually needs an operating voltage greater than 1V, large area and complex design, which is not suitable for multi-locations digital integration in on-chip heat management. Therefore, it becomes a hot and difficult subject in the industry to research on a kind of temperature sensor with high precision, small area, low voltage and low cost.

Figure 3:
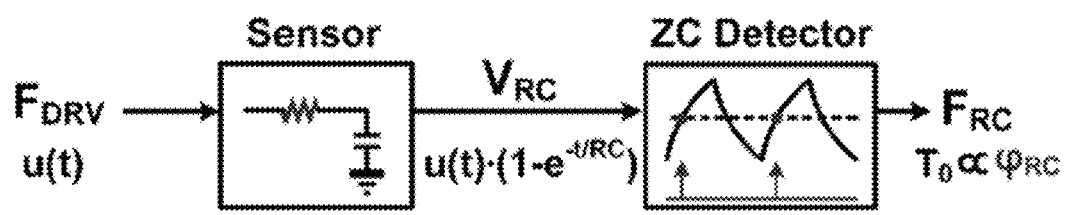
FIG. 3 illustrates a schematic diagram of a temperature sensor based on a resistor.

As shown in FIG. 3, this type temperature sensor can work under low voltage by using resistance as the temperature-sensitive device, but the relationship between resistance and temperature is nonlinear, therefore, additional circuits are needed for digital fitting, which leads to increase design complexity and the area occupied on the chip.

Figure 4:
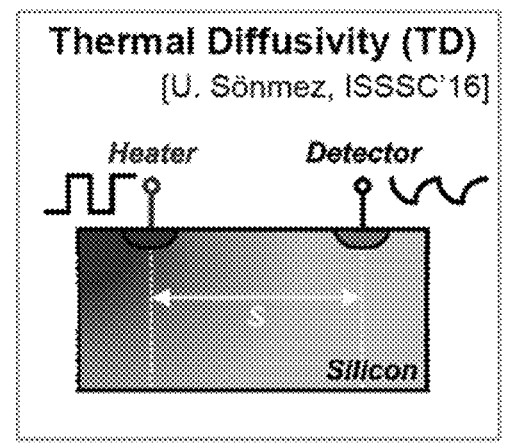
FIG. 4 is a diagram illustrating thermal diffusivity of an on-chip temperature sensor based on thermoelectric effect.

The on-chip temperature sensor based on thermoelectric effect measures temperature by using the relationship between thermoelectric power and temperature, as shown in FIG. 4. Although this type temperature sensor can work under a voltage less than 1V and occupies a small area on the chip, it needs a large working current, which leads to high power consumption and heating.

Figure 5:
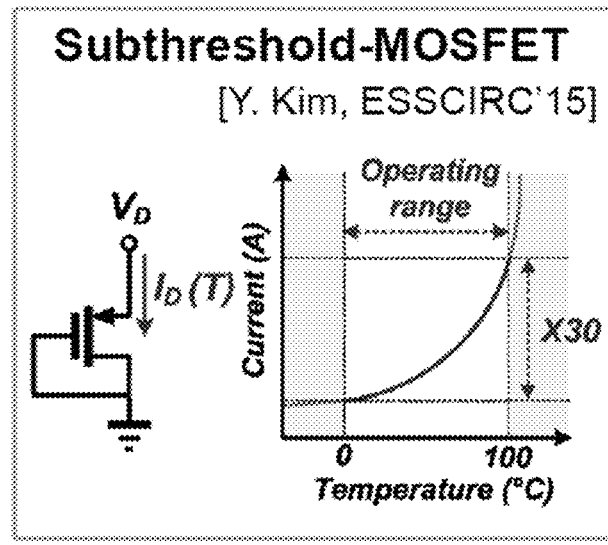
FIG. 5 is a schematic diagram illustrating an all-MOS temperature sensor.

The existing full-MOS temperature sensor converts temperature into delay by using the temperature characteristics of MOS transistors, as shown in FIG. 5. Although this type sensor can meet the requirements of small area and low voltage, its accuracy is insufficient because of the non-linearity of MOS process parameters and the interference of supply voltage to circuit delay. In addition, almost existing technologies are unfavorable to migration process due to use simulation designing method.

Various embodiments of the present disclosure will be further described in conjunction with the drawings and specific embodiments, but the scope of protection of the present disclosure is not limited thereto.

Figure 7:
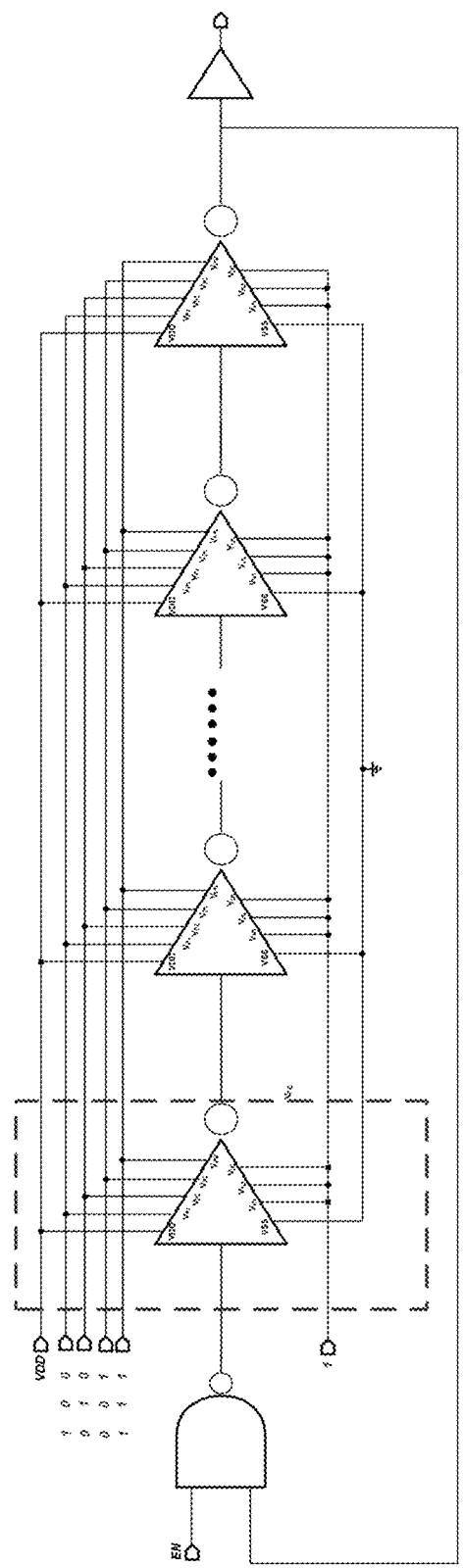
FIG. 7 illustrates another schematic circuit diagram of the temperature sensor according to some embodiments of the present disclosure.

A temperature sensor according to some embodiments of the present disclosure can include a NAND gate and K delay units, where K is an even number greater than 0. The NAND gate comprises two input terminals and an output terminal, one input terminal inputs starting control signal. K delay units are connected in series, the input end of the first delay unit is connected to the output terminal of the NAND gate, and the output end of the last delay unit is connected to another input terminal of the NAND gate, as shown in FIG. 7. It can be seen that the temperature sensor circuit is a type of ring oscillator structure. The current can be characterized by the output frequency of ring oscillator based on the feature of ring oscillator, therefore, the temperature sensor according to some embodiments of the present disclosure can be used to measure temperature by digital output.

Each delay unit includes n stage inverters in series (n is an odd number greater than 1), and each stage inverter is connected with a PMOS and a NMOS to control the inverter in on-state or off-state. The output end of the former stage inverter is connected with the input end of the latter stage inverter; define the PMOS transistor and NMOS transistor connected with the i-th stage inverter as $M_{Pi}$ and $M_{Ni}$ respectively, the source end of $M_{Ni}$ is connected to GND, the drain end of $M_{Ni}$ is connected to the i-th stage inverter, the gate electrode of $M_{Ni}$ is connected to the signal line $V_{Ni}$, the drain end of $M_{Pi}$ is connected to the i-th stage inverter, the source end of $M_{Pi}$ is connected to power supply, the gate electrode of $M_{Pi}$ is connected to the signal line $V_{Pi}$, the substrate end of $M_{Pi}$ is connected to the signal line $V_{PB}$, i is an integer and i∈[1, n].

In some embodiments, for the K delay units, the number of inverters (the value of n) is the same in each delay unit.

In some embodiments, the gate electrodes of the same stage NMOS transistors in all delay units are connected to one signal line and are controlled by this signal line, the gate electrodes of the same stage PMOS transistors in all delay units are connected to one signal line and are controlled by this signal line, in other words, the $V_{Ni}$ with the same value of i in all delay units are connected to a same signal line, the $V_{Pi}$ with the same value of i in all delay units are connected to a same signal line; the control bits can be reduced by this connection method to realize easy control.

Figure 6:
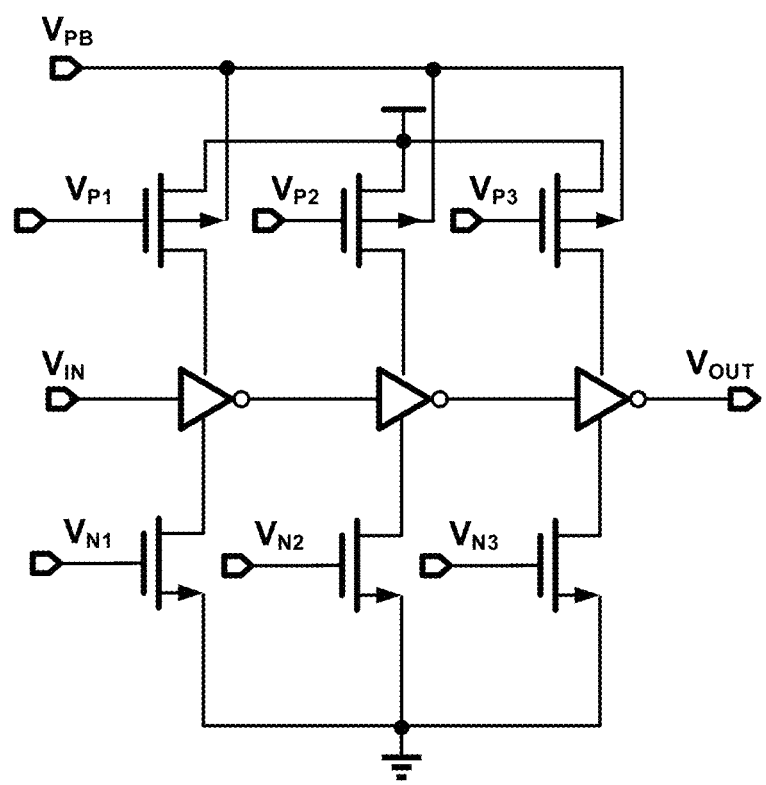
FIG. 6 illustrates a circuit diagram of a delay unit according to some embodiments of the present disclosure.
Figure 8:
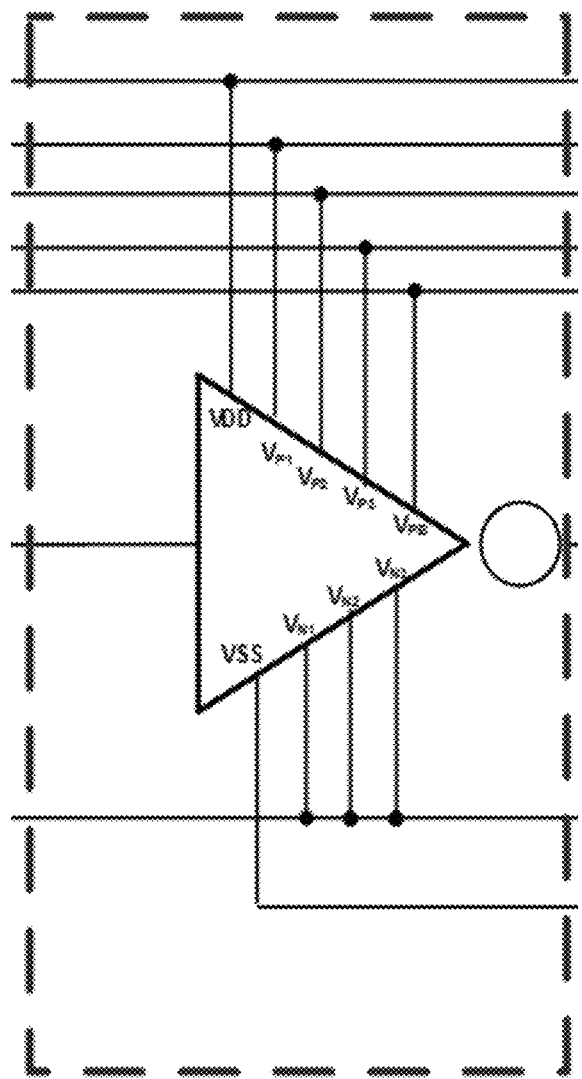
FIG. 8 illustrates a schematic circuit diagram of a delay unit in the FIG. 6.

In this embodiment, a delay unit in the temperature sensor is composed of three stage inverters, as shown in FIG. 6, FIG. 7, and FIG. 8. Each inverter has a PMOS and an NMOS in series to control the inverter in on-state or off-state, the output end of the former stage inverter connected to the input end of the latter stage inverter. The first stage inverter is connected with $M_{P1}$ and $M_{N1}$, the second stage inverter is connected with $M_{P2}$ and $M_{N2}$, and the third stage inverter is connected with $M_{P3}$ and $M_{N3}$. The electrical connection of each delay unit as follows: the source ends of $M_{N1}$, $M_{N2}$ and $M_{N3}$ are connected to GND, the drain ends of $M_{N1}$, $M_{N2}$ and $M_{N3}$ are connected to the low voltage ends of the first, second and third stage inverters respectively, the gate electrodes of $M_{N1}$, $M_{N2}$ and $M_{N3}$ are connected to the signal line $V_{N1}$, $V_{N2}$ and $V_{N3}$ respectively; the drain ends of $M_{P1}$, $M_{P2}$ and $M_{P3}$ are connected to the high voltage ends of the first, second and third stage inverters respectively, the source ends of $M_{P1}$, $M_{P2}$ and $M_{P3}$ are connected to power supply (higher potential), the gate electrodes of $M_{P1}$, $M_{P2}$ and $M_{P3}$ are connected to the signal line $V_{P1}$, $V_{P2}$ and $V_{P3}$ respectively, the substrate ends of $M_{P1}$, $M_{P2}$ and $M_{P3}$ are connected to the signal line $V_{PB}$.

The temperature sensor according to some embodiments of the present disclosure can work in three modes: P-mode, N-mode and voltage-mode. Wherein, P-mode and N-mode are used for temperature measurement, voltage-mode can be used for digital calibration under temperature measurement scene, and voltage-mode also can be used for voltage measurement or process corner evaluation.

Figure 9:
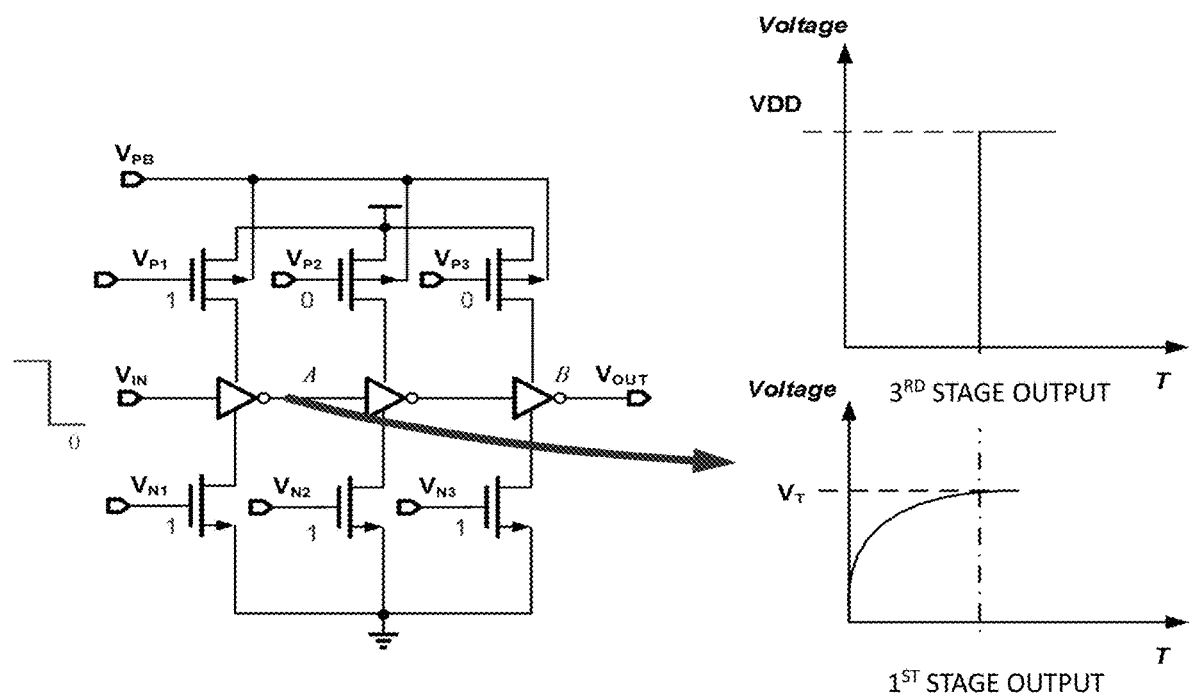
FIG. 9 is a diagram illustrating a work principle of a delay unit in P-mode.
Figure 10:
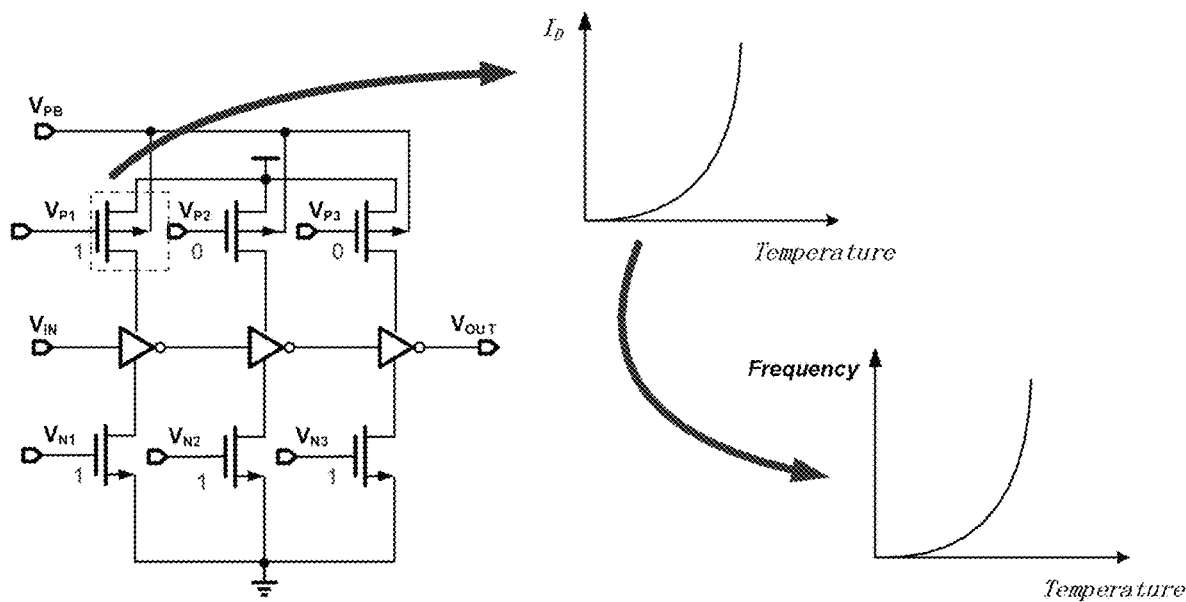
FIG. 10 is a diagram illustrating a work principle of a delay unit in P-mode.

In this embodiment, a delay unit in the temperature sensor is composed of three stage inverters, The P-mode is further described in conjunction with FIG. 9 and FIG. 10. All the NMOS transistors in all the delay units are controlled to be in on-states, the first stage PMOS transistors in all the delay units are controlled to be in off states, the two next stages (i.e., the second and the third) PMOS transistors in each delay unit are controlled to be in on states; therefore the first stage inverters in delay units work in the state of leakage, and the second stage and the third stage inverters are equivalent in function to an ordinary buffer. A jump from high level to low level is applied at the input end of ($V_{IN}$) the delay unit, a low level is outputted by the inverter connected to the off-state PMOS transistor, the outputted low level is gradually charged until it reaches the threshold voltage of the second stage inverter, the second stage inverter works and reverses its input, the third inverter continue to output according the function of inverter. Because of the strong correlation between leakage current of MOS transistor and temperature, the output frequency of ring oscillator is also strongly correlated with temperature. Therefore the output frequency of the temperature sensor can be used to detects temperature changes.

Figure 11:
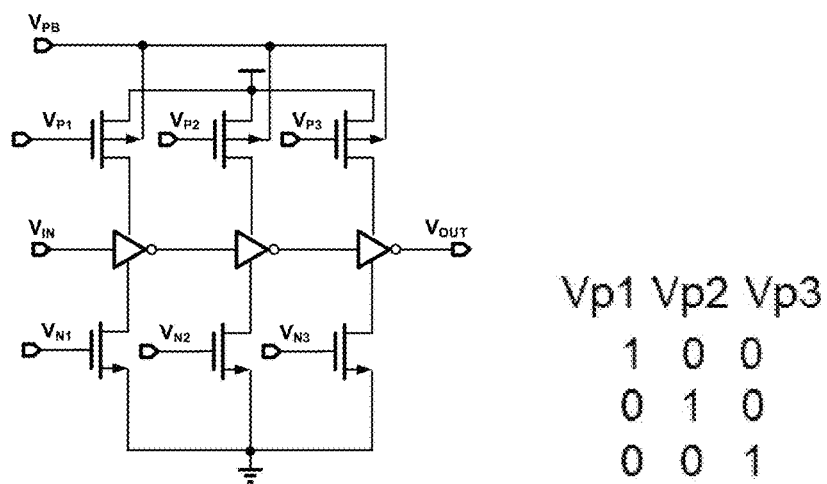
FIG. 11 is a diagram illustrating a process countermeasure work principle of a delay unit in P-mode.

In addition to the above temperature measurement functions, the temperature sensor according to some embodiments of the present disclosure can also support process countermeasure control. As shown in FIG. 11, taking the method of temperature measurement in P-mode as an example, the first stage, the second stage and third stage inverters can be reconfigured to work in the state of leakage respectively, and three temperature values can be measured, take the average value of the three temperature values to offset the process deviation of a single MOS transistor, so as to achieve more accurate measurement. In some embodiments, the more stage inverters in each delay unit the better process countermeasure control.

The N-mode is further described in conjunction with the specific embodiment. All the PMOS transistors in each delay unit are controlled in on-state, the first stage NMOS transistors in all the delay units are controlled to be in off states, the two next stages (i.e., the second and the third stages) NMOS transistors in each delay unit are controlled to be in on states; therefore the first stage inverters in delay units work in the state of leakage, and the second stage and the third stage inverters are equivalent in function to an ordinary buffer. The principle of temperature measurement of N-mode is similar to P-mode, the delay of the delay unit is mainly determined by the first stage NMOS transistors work in the state of leakage, and the output frequency of the ring oscillator structure composed by several delay units is also mainly determined by the NMOS transistors work in the state of leakage. Because of the strong correlation between leakage current of MOS transistor and temperature, the output frequency of ring oscillator is also strongly correlated with temperature. Therefore, the output frequency of the temperature sensor can be used to detects temperature changes.

Similar to P-mode, the temperature sensor according to some embodiments of the present disclosure can function in N-mode also supports process countermeasure control. The first stage, the second stage and third stage inverters can be reconfigured to work in the state of leakage respectively, and three temperature values can be measured, take the average value of the three temperature values to offset the process deviation of a single MOS transistor, so as to achieve more accurate measurement. In some embodiments, the more stage inverters in each delay unit the better process countermeasure control.

The voltage-mode is further described in conjunction with the specific embodiment. In this embodiment, each delay unit of the temperature sensor includes three stage inverters, all the PMOS and NMOS are controlled in on-state, the temperature sensor works in voltage-mode; for a delay unit, the sensitivity of supply voltage is much greater than that of temperature, the output frequency of the ring oscillator structure has approximate linear relationship with supply voltage, therefore, the voltage-mode of the temperature sensor can be used to measure the value of the supply voltage, and the temperature value in P-mode and/or N-mode can be used for calibration of voltage measurement in voltage-mode, so as to improve the accuracy of voltage measurement. Moreover, the voltage value measured in voltage-mode also can be used for calibration of temperature measurement in P-mode or N-mode, so as to improve the accuracy of temperature measurement.

In voltage-mode, the temperature sensor according to some embodiments of the present disclosure can be extended to process corner evaluation. apply a known voltage to the temperature sensor, and control the temperature sensor in the voltage-mode, the process corner can be evaluated through the output distribution of different chips.

In some embodiments, all the modules used can be found in standard digital units, including ordinary inverters (INV), NAND gates (NAND), PMOS (Header) for power gating, and NMOS (footer) for power gating, therefore the proposal supports digital design and greatly reduces the complexity of design. The output frequency measurement of the ring oscillator structure can be obtained by reference clock and counter, and the frequency measurement circuit can be shared in multi-point measurement so as to reduce area occupied of the temperature sensors.

Other implementation solutions of the present disclosure will be apparent to those skilled in the art from consideration of the specification and practice of the present disclosure. This disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A temperature sensor comprising:
   a NAND gate; and
   K delay units;
   wherein:
   the NAND gate comprises a first and a second input terminals and an output terminal;
   the first input terminal is coupled to an external starting control signal;
   the K delay units are connected in series;
   an input end of the first delay unit is connected to the output terminal of the NAND gate;
   an output end of a last delay unit among the K delay units is connected to the second input terminal of the NAND gate;
   K is an even number greater than 0;
   each delay unit comprises n stage inverters in series, wherein n is an odd number greater than 1;
   for each delay unit, an output end of a former stage inverter is connected with an input end of a latter stage inverter, each stage inverter is connected with a PMOS transistor and an NMOS transistor to control the each stage inverter in an on-state or an off-state, wherein the PMOS transistor and the NMOS transistor connected with an i-th stage inverter are referred to as $M_{Pi}$ and $M_{Ni}$, respectively; and
   a source end of the $M_{Ni}$ is connected to GND, a drain end of the $M_{Ni}$ is connected to the i-th stage inverter, a gate electrode of the $M_{Ni}$ is connected to a signal line $V_{Ni}$, a drain end of the $M_{Pi}$ is connected to the i-th stage inverter, a source end of the $M_{Pi}$ is connected to a power supply, a gate electrode of the $M_{Pi}$ is connected to a signal line $V_{Pi}$, and a substrate end of the $M_{Pi}$ is connected to a signal line $V_{PB}$.

2. The temperature sensor of claim 1, wherein every delay unit of the temperature sensor has a same number of inverters.

3. The temperature sensor of claim 2, wherein gate electrodes of same stage NMOS transistors in the delay units are connected to one signal line, and the signal line $V_{Ni}$ with same value of i in all delay units are controlled with a same signal line.

4. The temperature sensor of claim 2, wherein gate electrodes of same stage PMOS transistors in the delay units are connected to one signal line, and the signal lines $V_{Pi}$ with the same value of i in all delay units are controlled with a same signal line.

5. A method for supply voltage measurement with the temperature sensor of claim 1, comprising controlling the temperature sensor in a voltage-mode and obtaining a supply voltage through measuring an output frequency of the temperature sensor;
   wherein:
   the voltage-mode refers to: controlling all the PMOS transistors and NMOS transistors in each delay unit of the temperature sensor to be in on-state.

6. A method for temperature measurement calibration with the temperature sensor of claim 1, wherein in a voltage-mode, the method comprises measuring an output frequency of the temperature sensor to obtain the supply voltage, and the supply voltage is configured for calibration of temperature measurement in P-mode or N-mode.

7. A method for supplying voltage calibration with the temperature sensor of claim 1, comprising:
   obtaining temperature values in P-mode and N-mode respectively; and
   calibrating voltage measurement in a voltage mode with the temperature values measured in the P-mode and/or the N-mode.

8. A method for process corner evaluation with the temperature sensor of claim 1, comprising:
   applying a known voltage to the temperature sensor;

control the temperature sensor in a voltage-mode; and
evaluating process corners through an output distribution of different chips.

9. A test system comprising the temperature sensor of claim 1, wherein the temperature sensor is configured to monitor a temperature of the test system.

10. The test system of claim 9, further comprising a device or chip undergoing heat management.

11. The test system of claim 9, further comprising a device or chip undergoing supply voltage measurement.

12. The test system of claim 9, further comprising a device or chip for evaluating process corners.

13. A method for temperature measurement with a temperature sensor,
the temperature sensor comprising:
a NAND gate; and
K delay units;
wherein:
the NAND gate comprises a first and a second input terminals and an output terminal;
the first input terminal is coupled to an external starting control signal;
the K delay units are connected in series;
an input end of the first delay unit is connected to the output terminal of the NAND gate;
an output end of a last delay unit among the K delay units is connected to the second input terminal of the NAND gate;
K is an even number greater than 0;
each delay unit comprises n stage inverters in series, wherein n is an odd number greater than 1;
each stage inverter is connected with a PMOS transistor and an NMOS transistor to control the each stage inverter in an on-state or an off-state; and
the method comprising:
an output frequency of the temperature sensor in P-mode or N-mode is measured to obtain a temperature value; wherein:
the P-mode refers to: for the temperature sensor, the NMOS transistors in each delay unit are in on-state, one of the PMOS transistors in each delay unit is in off-state, and the other PMOS transistors in each delay unit are in on-state; and
the N-mode refers to: for the temperature sensor, the PMOS transistors in each delay unit are in on-state, and one of the NMOS transistors in each delay unit is in off-state, and the other NMOS transistors in each delay unit are in on-state.

14. The method for temperature measurement of claim 4, wherein inverters of the K delay units functioning in leakage states are same stage inverters.

15. The method for temperature measurement of claim 13, wherein a measuring procedure of the P-mode further comprises:
P1, for each delay unit of the temperature sensor, control all the NMOS transistors in on-state, one of the PMOS transistors $M_{Pi}$ in off-state, and the other PMOS transistors in on-state, then measure the temperature value $T_{Pi}$ through the temperature sensor;
P2, repeat the P1 step with traversing the value of variable i, and a corresponding temperature value $T_{Pi}$ is obtained respectively, i is an integer and i∈[1, n];
P3, take an average value of the temperature value $T_{Pi}$ as a final value of temperature.

16. The method for temperature measurement of claim 13, wherein a measuring procedure of N-mode further comprises:
N1, for each delay unit of the temperature sensor, control all the PMOS transistors in on-state, one of the NMOS transistors $M_{Ni}$ in off-state, and the other NMOS transistors in on-state, then measure the temperature value $T_{Ni}$ through the temperature sensor;
N2, repeat the N1 step with traversing the value of variable i, and the corresponding temperature value $T_{Ni}$ can be obtained respectively, i is an integer and i∈[1, n];
N3, take an average value of the temperature value $T_{Ni}$ as a final value of temperature.

17. An apparatus comprising a temperature sensor, wherein
the temperature sensor comprises:
a NAND gate; and
K delay units;
wherein:
the NAND gate comprises a first and a second input terminals and an output terminal;
the first input terminal is coupled to an external starting control signal;
the K delay units are connected in series;
an input end of the first delay unit is connected to the output terminal of the NAND gate;
an output end of a last delay unit among the K delay units is connected to the second input terminal of the NAND gate;
K is an even number greater than 0;
each delay unit comprises n stage inverters in series, wherein n is an odd number greater than 1;
each stage inverter is connected with a PMOS transistor and an NMOS transistor to control the each stage inverter in an on-state or an off-state; and
the temperature sensor is configured to realize conversion from temperature to current based on a relationship between leakage current of MOS transistors and temperature, and further realize conversion from current to frequency based on a ring oscillator structure, so as to realize digital output of temperature measurement.

18. The apparatus of claim 17, wherein the temperature sensor is configured to function in a temperature range of −40~125° C. and under a digital power supply of less than 1V, having an accuracy of better than 2° C.

19. The apparatus of claim 17, wherein the temperature sensor is an all-digital, reconfigurable temperature sensor.

* * * * *